(12) United States Patent
Chen

(10) Patent No.: US 10,264,703 B2
(45) Date of Patent: Apr. 16, 2019

(54) HEAT DISSIPATING STRUCTURE

(71) Applicant: Hitron Technologies Inc., Hsinchu (TW)

(72) Inventor: Hui-Liang Chen, Zhubei (TW)

(73) Assignee: Hitron Technologies Inc., Hsinchu (TW)

( * ) Notice: Subject to any disclaimer, the term of this patent is extended or adjusted under 35 U.S.C. 154(b) by 0 days.

(21) Appl. No.: 15/599,437

(22) Filed: May 18, 2017

(65) Prior Publication Data
US 2018/0153057 A1    May 31, 2018

Related U.S. Application Data

(60) Provisional application No. 62/426,587, filed on Nov. 27, 2016.

(51) Int. Cl.
| | | |
|---|---|---|
| H05K 7/20 | (2006.01) | |
| H04B 1/036 | (2006.01) | |
| H05K 1/02 | (2006.01) | |
| H05K 3/36 | (2006.01) | |

(52) U.S. Cl.
CPC ......... *H05K 7/20127* (2013.01); *H04B 1/036* (2013.01); *H05K 1/0209* (2013.01); *H05K 3/366* (2013.01); *H05K 2201/047* (2013.01)

(58) Field of Classification Search
CPC ............... H05K 1/0203; H05K 1/144; H05K 2201/10371; H05K 7/20509; H05K 7/20409; H05K 7/20209; H05K 7/2039; H05K 2201/06; H05K 7/1427; H05K 5/0217; H05K 9/0007; H05K 7/20418; H05K 1/0209; H05K 2201/066; H05K 5/04; G06F 1/20; G06F 1/181; F28F 2013/006; F28F 21/08; F28F 21/081; Y10T 29/49826; Y10T 29/49126

USPC .......... 361/721, 690, 704, 719, 714, 679.02, 361/688, 703, 702, 707, 720, 729, 730, 361/749, 752, 796; 165/80.3, 104.26, 165/104.33

See application file for complete search history.

(56) References Cited

U.S. PATENT DOCUMENTS

| | | | | |
|---|---|---|---|---|
| 7,746,638 B2 * | 6/2010 | Takawa | ................ | G02B 6/4201 165/104.26 |
| 9,069,535 B2 * | 6/2015 | Degner | ...................... | G06F 1/20 |
| 2011/0090628 A1 * | 4/2011 | Sullivan | .................... | G06F 1/16 361/679.02 |
| 2012/0201007 A1 * | 8/2012 | Yeh | ...................... | H05K 1/0203 361/719 |

(Continued)

*Primary Examiner* — Mandeep S Buttar
(74) *Attorney, Agent, or Firm* — OPES IP Consulting Co., Ltd.

(57) ABSTRACT

A heat dissipating structure generally utilized in a telecommunication product includes a plurality of PCB modules, a metal framework, a top lid, and a perforated panel. The heat dissipating structure is generally utilized in a telecommunication product. The plurality of PCB modules are coupled in series and configured to form a chassis. The metal framework is housed within the chassis and forms an internal chamber. The top lid is disposed at a top side of the heat dissipating structure. The perforated panel is disposed below the top lid and over the internal chamber. The perforated panel includes a plurality of ventilation holes. The internal chamber cooperates with the plurality of ventilation holes to dissipate heat.

15 Claims, 7 Drawing Sheets

(56) References Cited

U.S. PATENT DOCUMENTS

| | | | |
|---|---|---|---|
| 2014/0321046 A1* | 10/2014 | Sinha | G06F 1/182 |
| | | | 361/679.33 |
| 2015/0351586 A1* | 12/2015 | Taylor | A47J 37/0786 |
| | | | 99/445 |
| 2016/0234159 A1* | 8/2016 | Cooper | H04M 3/42102 |
| 2016/0282913 A1* | 9/2016 | Degner | G06F 1/20 |

* cited by examiner

HEAT DISSIPATING STRUCTURE

CROSS REFERENCE TO RELATED APPLICATION

The present application claims priority to U.S. Provisional Application Ser. No. 62/426,587 filed on Nov. 27, 2016, titled in "Cable Gateway Structure", which is hereby incorporated by reference in its entirety.

TECHNICAL FIELD

This document relates to a heat dissipating structure, and more particularly, to a heat dissipating structure having a metal framework that can dissipate heat and resist electrical interferences efficiently. The heat dissipating structure is utilized generally in a telecommunication product.

BACKGROUNDS

Conventionally, a cable gateway (CG) has multiple functions and broadband requirements. These functions and requirements not only increase CG's volume, but also create over-heating and electrical problems such as electromagnetic interference (EMI), electrostatic discharge (ESD) and power surge. Moreover, the performance of the CG may be compromised if heat is not dissipated efficiently. Some CG uses fans to lower its temperature. However, the incorporation of fans increases both costs and power consumption.

SUMMARY

This document discloses a heat dissipating structure that can dissipate heat efficiently. The heat dissipating structure is generally utilized in a telecommunication product. The heat dissipating structure includes a plurality of printed circuit board (PCB) modules, a metal framework, a top lid (or cover), and a perforated panel. The plurality of PCB modules are coupled in series and configured to form a chassis. The metal framework is housed within the chassis and forms an internal chamber. The top lid is disposed at a top side of the heat dissipating structure. The perforated panel is disposed below the top lid and over the internal chamber. The perforated panel includes a plurality of ventilation holes. The internal chamber cooperates with the plurality of ventilation holes to dissipate heat.

BRIEF DESCRIPTION OF THE SEVERAL VIEWS OF THE DRAWINGS

The foregoing summary, as well as the following detailed description of this document, will be better understood when read in conjunction with the appended drawings. For the purpose of illustrating this document, some preferred embodiments are shown in the drawings. It should be understood, however, that the present document is not limited to the precise arrangements and instrumentalities shown.

In the drawings.

DETAILED DESCRIPTION

Reference will now be made in detail to the examples of this document, which are illustrated in the accompanying drawings. Wherever possible, the same reference numbers will be used throughout the drawings to refer to the same or like parts.

This document discloses a novel heat dissipating structure that can efficiently dissipate heat to prevent overheating. The heat dissipating structure is generally utilized in a telecommunication (i.e., telecom) product. In one example, the telecommunication product is a product that can connect to cloud for data stream. Such product generally has a receiver, a transmitter, and a transmission medium, i.e., a physical channel capable of carrying signals. In another example, the telecommunication product is a CG with PCBs that produce high heat. In other examples, the telecommunication product may be a modem, such as a cable modem or a digital subscriber line (DSL) modem; an embedded media terminal adaptors (EMTA); a router or other types of general gateway systems. In one example, the telecommunication product is an indoor appliance (i.e., a home appliance), such as a Google Home, Google OnHub, Google Wifi, Amazon Echo, or Amazon Echo Dot. In a preferred example, a CG incorporating the present invention may efficiently dissipate heat.

Figure 1:
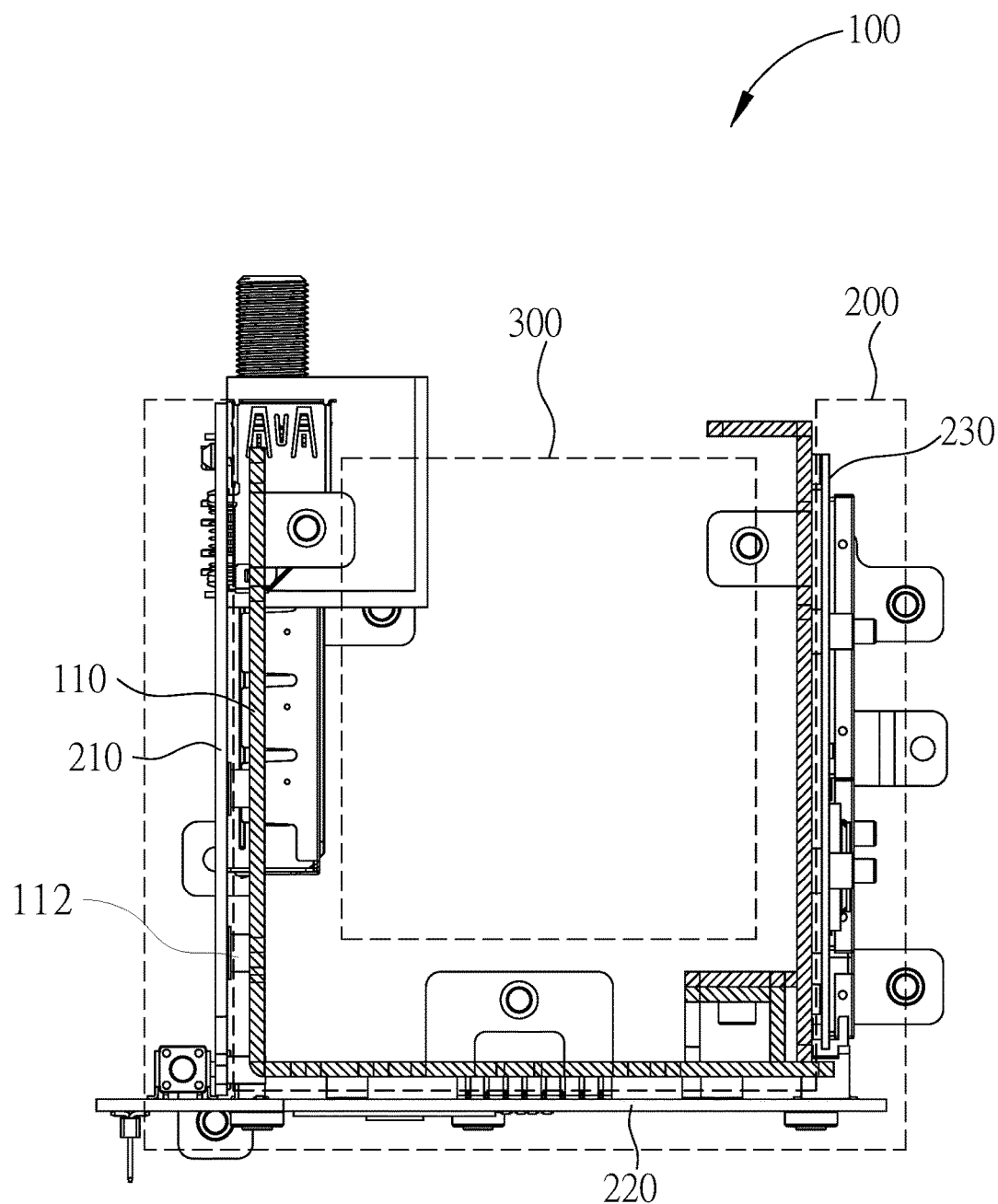
FIG. 1, FIG. 2 and FIG. 3 respectively illustrate a top view, a stereoscopic view and a perspective view of a heat dissipating structure according to one example of the present invention.
Figure 2:
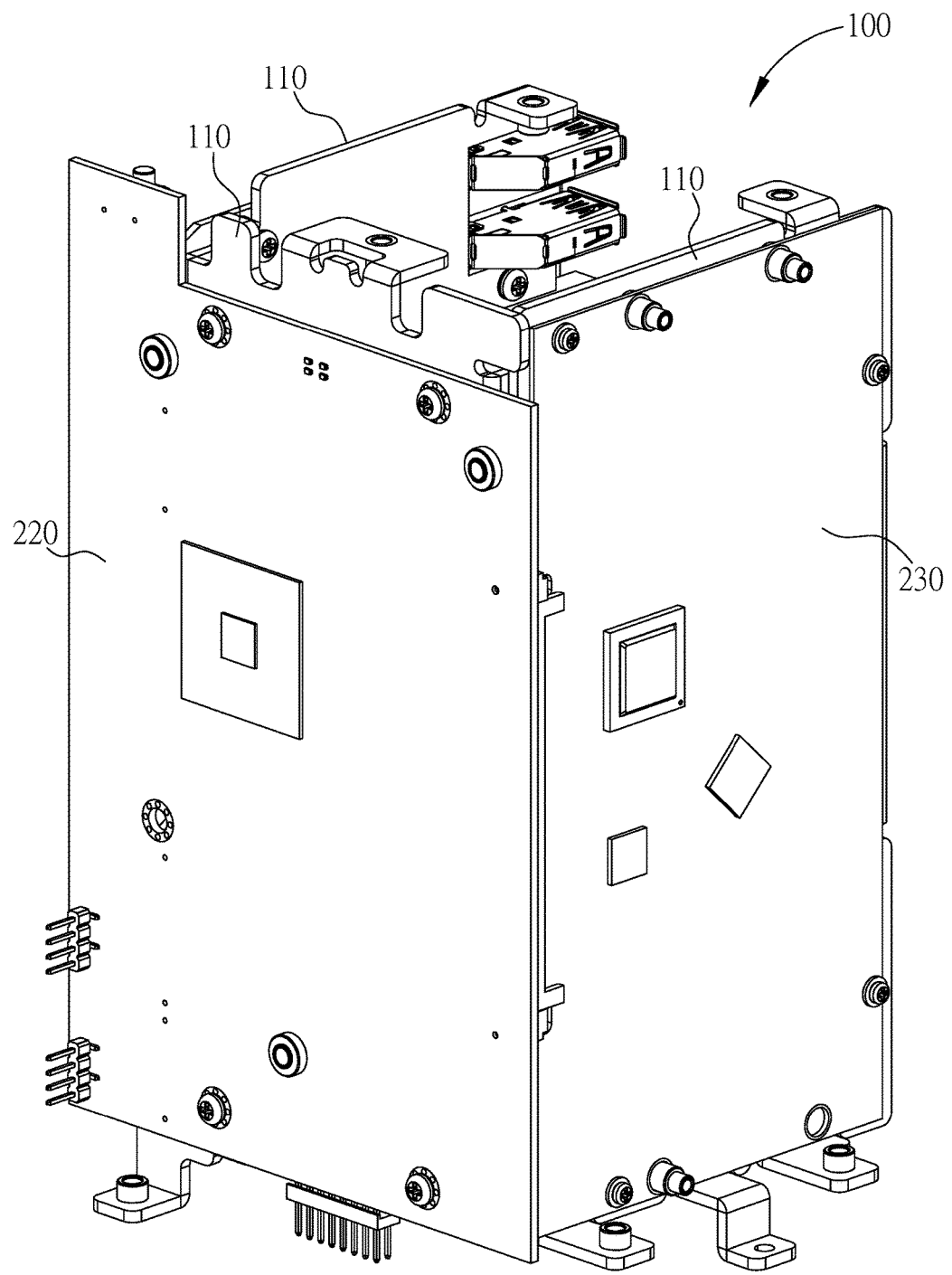
Figure 3:
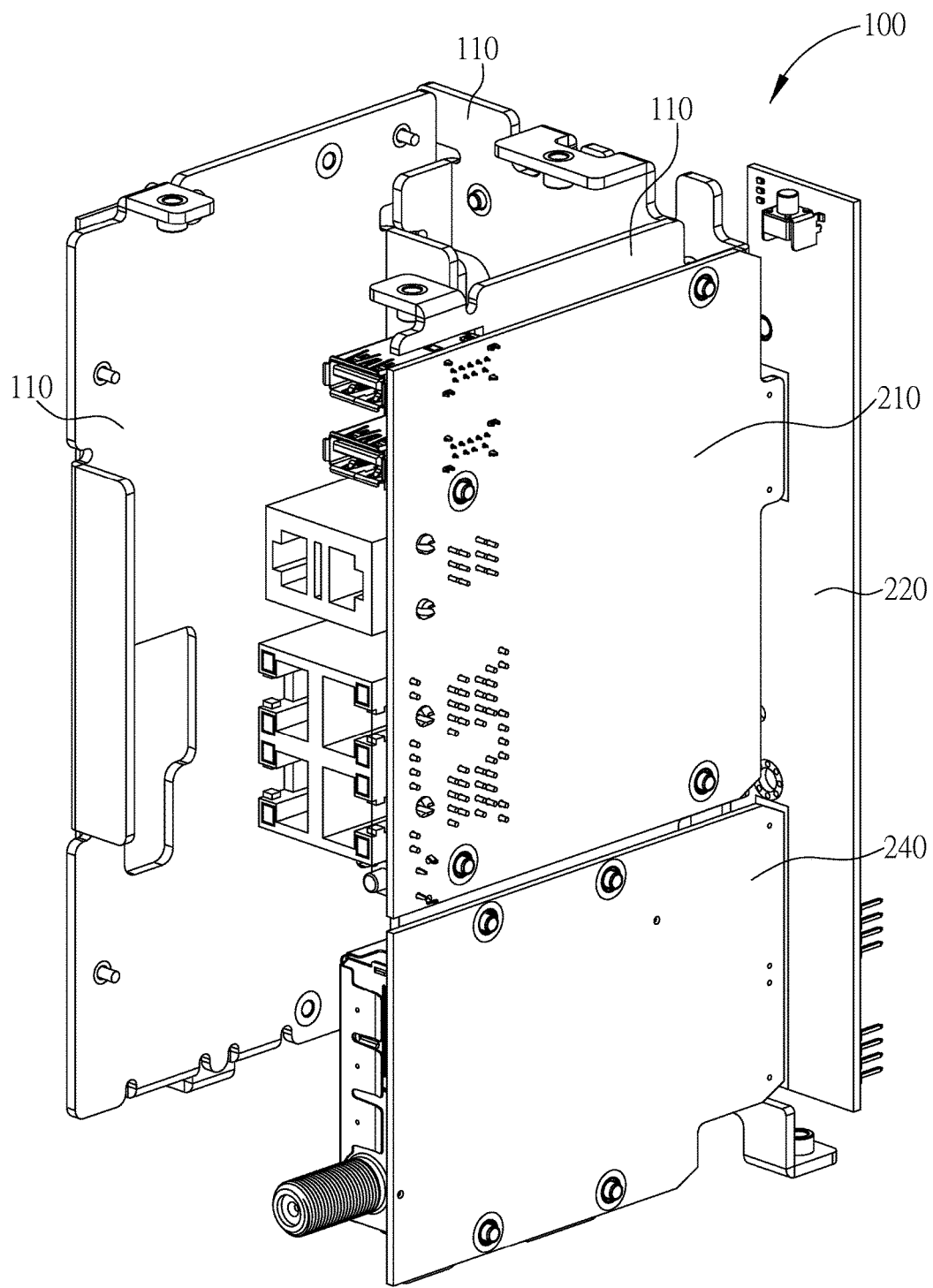

FIG. 1, FIG. 2 and FIG. 3 respectively illustrate a top view, a stereoscopic view and a perspective view of a heat dissipating structure 100 according to one example of the present invention.

The heat dissipating structure 100 includes at least a plurality of PCB modules 210, 220, 230 and 240, and a metal framework 110. Note that the number of PCB modules, and the manner in which such PCB modules are distributed, are not limited by the figures of this document. The performance of the heat dissipating structure 100 of the present invention should not be affected by the number or the distribution of the PCB modules.

In one example, the plurality of PCB modules 210, 220, 230 and 240 are coupled in series. The plurality of PCB modules 210, 220, 230 and 240 form a chassis 200. A metal framework 110 is housed within the chassis 200. The metal framework 110 forms an internal chamber 300.

In some examples, the metal framework 110 is made of a material with good thermal conductivity such as gold, copper, aluminum, or iron.

In one example, the metal framework 110 may be in direct contact with or in proximity of the plurality of PCB modules 210, 220, 230 and 240. In such configuration, heat generated by the plurality of PCB modules 210, 220, 230 and 240 can transmit to the internal chamber 300 via the metal framework 110 by heat conduction or thermal convection.

In another example, the metal framework 110 may absorb energy generated by electromagnetic interference (EMI), electrostatic discharge (ESD), power surge or any external interferences. The metal framework 110 may also absorb heat generated by internal components of the heat dissipating structure 100.

In one example, the metal framework 110 has the same shape as the chassis 200.

In other examples, the metal framework 110 and the chassis 200 may both have a laterally-close-loop shape, such as a square, rectangle, pentagon, hexagon or etc. Under the laterally-close-loop shape, the metal framework 110 should have at least four sides.

In another examples, the metal framework 110 and the chassis 200 may both have a laterally-open-loop shape, such as a U-shape, partially/laterally open square, rectangle, pentagon, hexagon or etc. Under the laterally-open-loop shape, the metal framework 110 should have at least three sides.

A preferred example of the present invention is a heat dissipating structure with a U-shaped metal framework 110 and a U-shaped chassis 200 that are identical in size. Such structure provides the best heat dissipating efficiency.

Another preferred example of the present invention is a heat dissipating structure that has a small volume with high density of internal components. As heat can generate quickly in such a configuration, the present invention's ability to effectively dissipate heat would prove to be vital.

In another example, the metal framework 110 and the chassis 200 may be of different shapes. For example, the metal framework 100 may have a U-shape while the chassis 200 has a rectangular or square shape.

In another example, to better dissipate heat generated from the chassis 200, the dimensions of the metal framework 110 shall at least be equal to the dimensions of the chassis 200 such that the plurality of PCB modules 210, 220, 230 and 240 may all be in contact with the metal framework 110.

Figure 4:
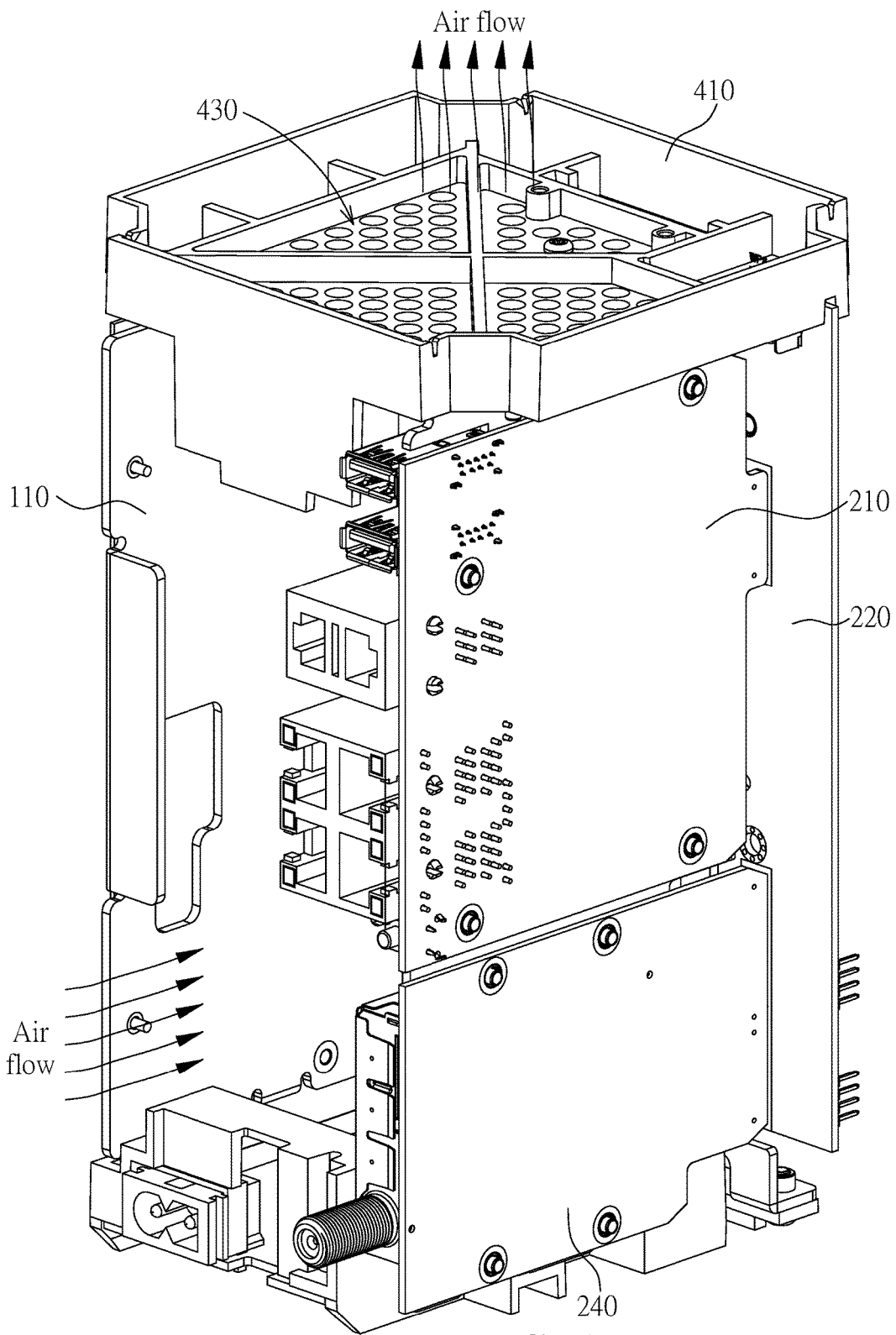
FIG. 4 and FIG. 5 illustrate perspective views of the heat dissipating structure shown in FIGS. 1-3.
Figure 5:
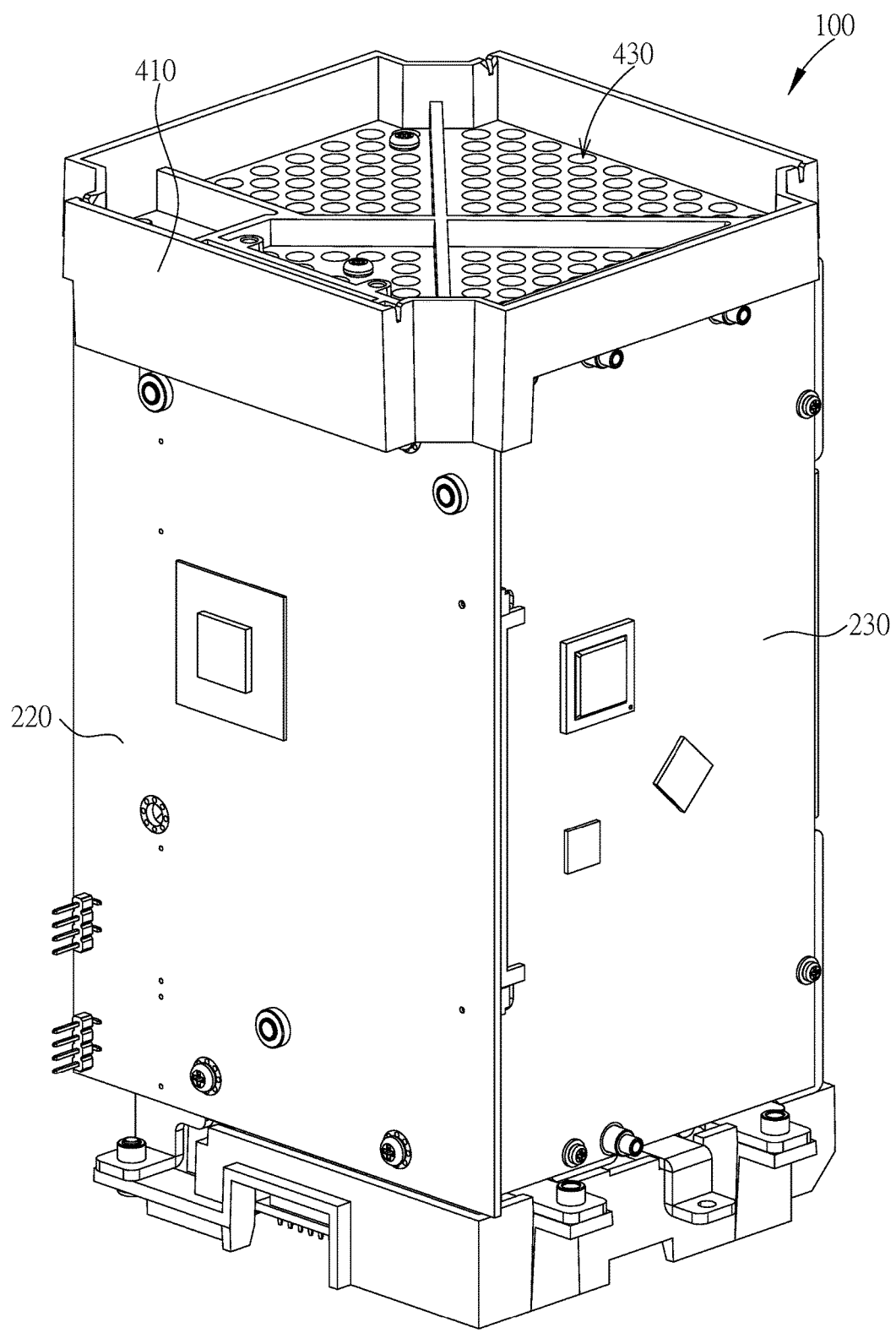

FIG. 4 and FIG. 5 illustrate other perspective views of the heat dissipating structure 100. The heat dissipating structure 100 further includes a perforated panel 410. In FIG. 4, a section of the metal framework 110 is covered by the PCB modules 210, 220 and 250 and cannot be seen. In FIG. 5, the metal framework 110 is covered by the PCB modules 220 and 230. The perforated panel 410 includes a plurality of ventilation holes 430. As can be observed in FIG. 4, air flow may enter from the bottom of the heat dissipating structure 100, pass through the internal chamber 300, and exit out of the perforated panel 410 through the plurality of ventilation holes 430. Heat generated by the components inside the heat dissipating structure 100 or from the surfaces of the internal chamber 300 may follow the airflow path described above and exit the heat dissipating structure 100. Specifically, the internal chamber 300 may achieve a stack effect (i.e., the chimney effect), allowing heat to ventilate out of the heat dissipating structure 100. With the aid of such heat-dissipating mechanism, fans are not needed. The manufacturing costs for the heat dissipating structure 100 and its power consumption therefore will be greatly reduced.

Figure 6:
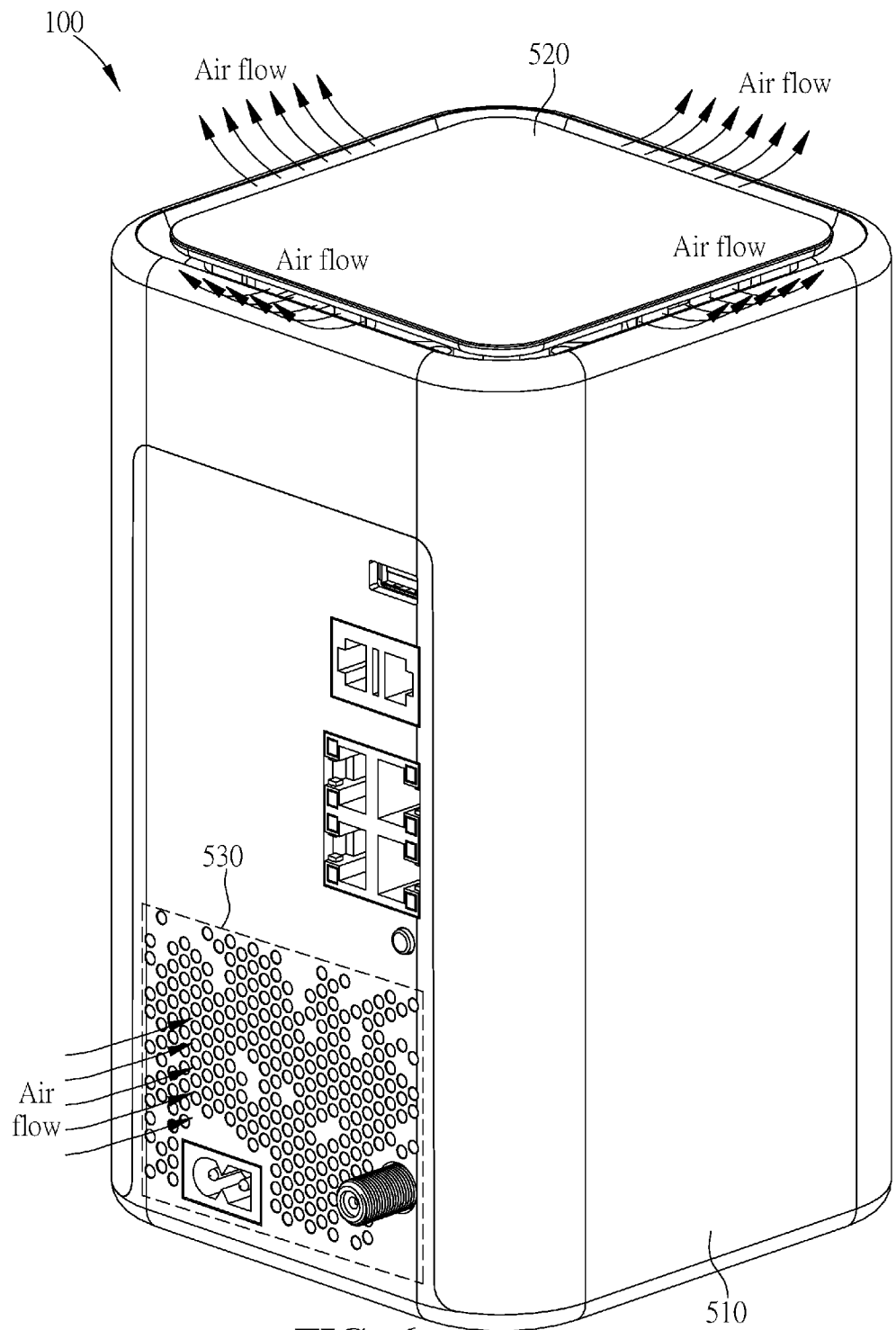
FIG. 6 is another stereoscopic view of the heat dissipating structure shown in FIGS. 1-3.
Figure 7:
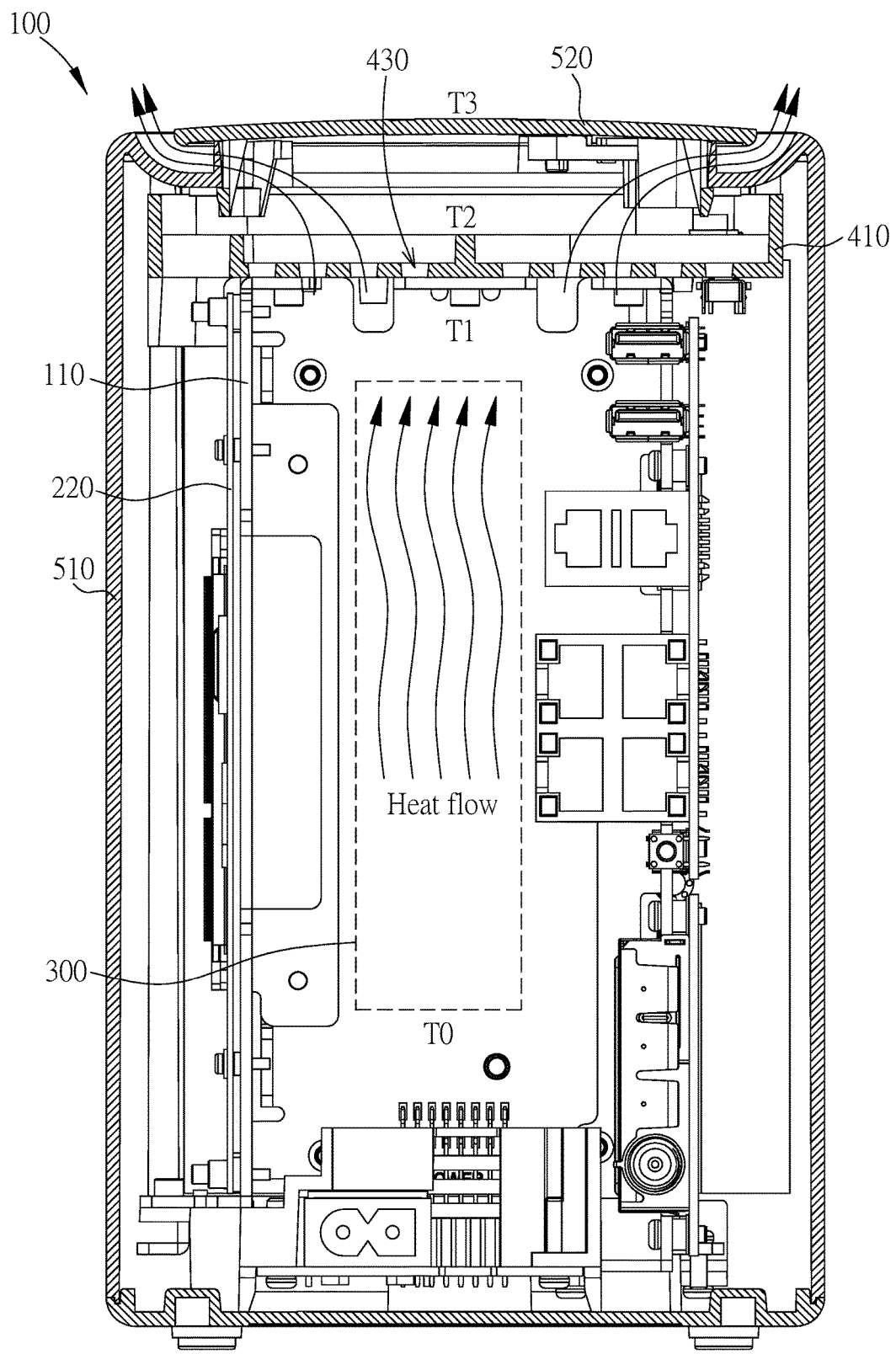
FIG. 7 is a lateral and perspective view of the heat dissipating structure shown in FIGS. 1-3.

FIG. 6 is another stereoscopic view of the heat dissipating structure 100. FIG. 7 is a lateral and perspective view of the heat dissipating structure 100.

The heat dissipating structure 100 further includes a housing 510 and a top lid 520. The housing 510 includes a perforated section 530. In one example, the perforated section 530 is disposed near the bottom of the heat dissipating structure 100, allowing exchange of airflow from/through the bottom of the heat dissipating structure 100. The housing 510 houses most of the elements of the heat dissipating structure 100, for examples, the metal framework 110, the plurality of PCB modules 210, 220, 230 and 240 and the perforated panel 410. The top lid 520 is disposed on a top side of the heat dissipating structure 100 and above the perforated panel 410. The air flow may enter the perforated section 530, pass through the internal chamber 300, and exit out of the top side of the heat dissipating structure 100 via an opening between the top lid 520 and the perforated panel 410.

FIG. 7 illustrates the temperature distribution of the heat dissipating structure 100. "T0" is the temperature at the bottom section of the internal chamber 300. "T1" is the temperature below the perforated panel 410, i.e., the temperature at the top section of the internal chamber 300. "T2" is the temperature at the opening between the perforated panel 410 and the top lid 520. "T3" is the temperature just above the top lid 520, i.e., the external temperature of the heat dissipating structure 100. In one example, the order of the abovementioned temperatures is T0>T1>T2>T3.

Temperature in the heat dissipating structure 100 may be changed by adjusting the heat pattern within the structure. Such heat pattern can be adjusted by changing the properties of the perforated panel 410, including adjusting the size, shape, number, distribution, pattern, or area ratio of the ventilation holes 430 on the perforated panel 410.

Specific target temperatures T3 may be achieved by adjusting the distance between the perforated panel 410 and the top lid 520. In one example, if a lower temperature T3 is desired, the distance between the perforated panel 410 and the top lid 520 should be lengthened. Conversely, if a higher temperature T3 is desired, the distance between the perforated panel 410 and the top lid 520 may be shorten.

In another example, enlarging the size of the ventilation holes 430 may lower temperature T3. Decreasing the size of the ventilation holes 430 may, conversely, increase the temperature T3.

In another example, lower temperature T3 may be achieved by puncturing more ventilation holes 430. Conversely, less ventilation holes will result in a higher temperature T3.

In another example, decreasing the depth of the ventilation holes 430, thereby creating shallower ventilation holes, may lower temperature T3. Conversely, increasing the depth of the ventilation holes 430 may increase temperature T3.

In another example, the shape of the ventilation holes 430 may be circular for better heat dissipation. In other examples, the shape of the ventilation holes 430 may be a triangle, square, pentagon, hexagon, or the like.

Area ratio is defined as the total area of the ventilation holes over the total area of the perforated panel. In one example, lower temperature T3 may be achieved by increasing the area ratio. Conversely, decreasing the area ratio may raise temperature T3.

In another example, the heat dissipating structure 100 may further include at least one heat-dissipating element 112 disposed between the metal framework 110 and anyone of the PCB modules 210, 220, 230 and 240. The heat-dissipating efficiency for the metal framework 110 may improve with the aid of the heat-dissipating element 112.

In one example, the heat-dissipating element 112 may include a metal pillar, metal pad, thermoplastic pillar, and/or thermoplastic pad. In one example, the thermoplastic pillar or the thermoplastic pad may be made of silicone.

In another example, the heat-dissipating element 112 may be a high thermal conductivity element that facilitates heat conductivity between the PCB modules 210, 220, 230 and 240 and the metal framework 110. In some examples, the high thermal conductivity element may include a thermoplastic element or a metal element.

In another example, the heat-dissipating element may be a high thermal conductivity element that facilitates heat conductivity between the PCB modules 210, 220, 230 and 240 and the metal framework 110. In some examples, the high thermal conductivity element may include a thermoplastic element or a metal element.

From the foregoing, it will be appreciated that specific embodiments have been described herein for purposes of illustration, but that various modifications may be made without deviating from the spirit and scope of the present technology. Moreover, aspects described in the context of particular embodiments may be combined or eliminated in other embodiments. Further, although advantages associated with certain embodiments have been described in the context of those embodiments, other embodiments may also exhibit such advantages, and not all embodiments need necessarily exhibit such advantages to fall within the scope of the present technology.

Unless the context clearly requires otherwise, throughout the description and the claims, the words "comprise," "comprising," and the like are to be construed in an inclusive sense (i.e., to say, in the sense of "including, but not limited to"), as opposed to an exclusive or exhaustive sense. Additionally, the words "herein," "above," "below," and words of similar import, when used in this application, refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

The above Detailed Description of examples of this document is not intended to be exhaustive or to limit this document to the precise form disclosed above. While specific examples for this document are described above for illustrative purposes, various equivalent modifications are possible within the scope of this document, as those skilled in the relevant art will recognize. While processes or blocks are presented in a given order in this application, alternative implementations may perform routines having steps performed in a different order, or employ systems having blocks in a different order. Some processes or blocks may be deleted, moved, added, subdivided, combined, and/or modified to provide alternative or sub-combinations. Also, while processes or blocks are at times shown as being performed in series, these processes or blocks may instead be performed or implemented in parallel, or may be performed at different times. Further any specific numbers noted herein are only examples. It is understood that alternative implementations may employ differing values or ranges.

While the above description describes certain examples of this document, and describes the best mode contemplated, no matter how detailed the above appears in text, the present technology can be practiced in many ways. Details of the system may vary considerably in its specific implementation, while still being encompassed by the present technology disclosed herein. As noted above, particular terminology used when describing certain features or aspects of the present technology should not be taken to imply that the terminology is being redefined herein to be restricted to any specific characteristics, features, or aspects of the present technology with which that terminology is associated. In general, the terms used in the following claims should not be construed to limit the present technology to the specific examples disclosed in the specification, unless the above Detailed Description section explicitly defines such terms. Accordingly, the actual scope of the present technology encompasses not only the disclosed examples, but also all equivalent ways of practicing or implementing this document under the claims.

It can be appreciated by those skilled in the art that changes could be made to the examples described above without departing from the broad inventive concept thereof. It is understood, therefore, that this document is not limited to the particular examples disclosed, but it is intended to cover modifications within the spirit and scope of the present document as defined by the appended claims.

Further, in describing representative examples of the present document, the specification may have presented the method and/or process of the present document as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present document should not be limited to the performance of their steps in the order written, and one skilled in the art can readily appreciate that the sequences may be varied and still remain within the spirit and scope of the present document.

I claim:

1. A heat dissipating structure utilized in a telecommunication product, comprising:
   a plurality of printed circuit board (PCB) modules coupled in series and configured to form a chassis;
   a metal framework housed within the chassis and forms a laterally-opened internal chamber, wherein the metal framework is U-shaped that includes at least three sides;
   a top lid disposed at a top side of the heat dissipating structure; and
   a perforated panel disposed below the top lid and over the laterally-opened internal chamber, wherein the perforated panel includes a plurality of ventilation holes; and
   wherein the laterally-opened internal chamber cooperates with the plurality of ventilation holes to dissipate heat.

2. The heat dissipating structure of claim 1, wherein the plurality of PCB modules are coupled in a laterally-open loop.

3. The heat dissipating structure of claim 1, wherein the heat dissipating structure further comprises at least one heat-dissipating element disposed between anyone of the plurality of PCB modules and the metal framework.

4. The heat dissipating structure of claim 3, wherein the at least one of heat-dissipating element comprises a metal pillar, a metal pad, a thermoplastic pillar, and/or a thermoplastic pad.

5. The heat dissipating structure of claim 3, wherein the at least one heat-dissipating element comprises a high thermal conductivity element.

6. The heat dissipating structure of claim 5, wherein the high thermal conductivity element comprises a thermoplastic element or a metal element.

7. The heat dissipating structure of claim 6, wherein the thermoplastic element comprises a silicone element.

8. The heat dissipating structure of claim 1, wherein a size of each of the plurality of ventilation holes, a thickness of each of the plurality of ventilation holes, a number of the plurality of ventilation holes, a distance from the perforated panel to the top lid, an area ratio of the plurality of ventilation holes on the perforated panel or a distribution density of the plurality of ventilation holes over the perforated panel is determined according to a target temperature above the top lid.

9. The heat dissipating structure of claim 8, wherein the target temperature above the top lid is lowered by increasing the distance from the perforated panel to the top lid, increasing the size of each of the plurality of ventilation holes, increasing the number of the plurality of ventilation holes, increasing the area ratio of the plurality of ventilation holes on the perforated panel, decreasing the thickness of each of the plurality of ventilation holes, or decreasing the distribution density of the plurality of ventilation holes over the perforated panel.

10. The heat dissipating structure of claim 8, wherein the target temperature above the top lid is raised by decreasing the distance from the perforated panel to the top lid, decreasing the size of each of the plurality of ventilation holes, decreasing the number of the plurality of ventilation holes, decreasing the area ratio of the plurality of ventilation holes on the perforated panel, increasing the thickness of each of the plurality of ventilation holes, or increasing the distribution density of the plurality of ventilation holes over the perforated panel.

11. The heat dissipating structure of claim 1, wherein the metal framework is made of a high heat-conductivity metal.

12. The heat dissipating structure of claim 1, wherein the telecommunication product comprises a cable gateway.

13. The heat dissipating structure of claim 1, wherein the telecommunication product comprises a modem, an embedded media terminal adaptor, a router, or a general gateway system.

14. The heat dissipating structure of claim 1, wherein the telecommunication product comprises indoor appliances.

15. A heat dissipating structure utilized in a telecommunication product, comprising:

- a metal framework configured to form a laterally-open internal chamber, the metal framework is U-shaped and includes at least three sides;
- a plurality of printed circuit board (PCB) modules affixed to the U-shaped metal framework;
- a housing configured to house the U-shaped metal framework wherein the housing further comprises a perforated section disposed near the bottom of the housing;
- a top lid disposed at a top side of the housing; and
- a perforated panel disposed below the top lid and over the laterally-opened internal chamber, wherein the perforated panel includes a plurality of ventilation holes; and
- wherein the laterally-opened internal chamber cooperates with the plurality of ventilation holes to dissipate heat.

* * * * *